United States Patent [19]
Takeyama et al.

[11] Patent Number: 5,362,598
[45] Date of Patent: Nov. 8, 1994

[54] QUINONE DIAZIDE PHOTORESIST COMPOSITION CONTAINING ALKALI-SOLUBLE RESIN AND AN ULTRAVIOLET RAY ABSORBING DYE

[75] Inventors: Naoki Takeyama; Yasunori Uetani; Hirotoshi Nakanishi; Ryotaro Hanawa, all of Osaka, Japan

[73] Assignee: Sumitomo Chemical Co., Ltd., Osaka, Japan

[21] Appl. No.: 132,230

[22] Filed: Oct. 6, 1993

Related U.S. Application Data

[63] Continuation of Ser. No. 858,446, Mar. 24, 1992, abandoned, which is a continuation of Ser. No. 505,699, Apr. 6, 1990, abandoned.

[30] Foreign Application Priority Data

Apr. 10, 1989 [JP] Japan ................... 1-91551

[51] Int. Cl.$^5$ ................... G03F 7/023; G03C 1/61
[52] U.S. Cl. ................... 430/191; 430/165; 430/192; 430/193; 430/196; 430/197; 430/512
[58] Field of Search ............... 430/191, 192, 193, 196, 430/197, 512, 165

[56] References Cited

U.S. PATENT DOCUMENTS

| | | | |
|---|---|---|---|
| 4,135,007 | 11/1979 | Lorenz et al. | 427/44 |
| 4,349,619 | 9/1982 | Kamoshida et al. | 430/196 |
| 4,645,735 | 2/1987 | Sugimoto et al. | 430/512 |
| 4,882,260 | 11/1989 | Kohara et al. | 430/191 |
| 4,927,732 | 5/1990 | Merrem et al. | 430/191 |

FOREIGN PATENT DOCUMENTS

| | | |
|---|---|---|
| 0219010 | 4/1987 | European Pat. Off. |
| 0323631 | 7/1989 | European Pat. Off. |
| 61-93445 | 9/1986 | Japan |

OTHER PUBLICATIONS

Rai et al. (1979) Indian J. Chem. 17B:287–288.
Manrao et al (1984) Pesticides p. 30 and 36.

Primary Examiner—Charles L. Bowers, Jr.
Assistant Examiner—Christopher G. Young
Attorney, Agent, or Firm—Birch, Stewart, Kolasch & Birch

[57] ABSTRACT

A photoresist composition which comprises a compound of the general formula:

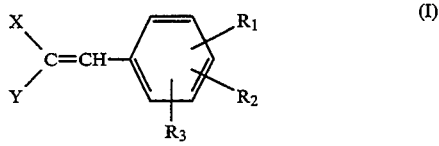

(I)

wherein $R_1$, $R_2$ and $R_3$ are the same or different and represent a hydrogen atom, a hydroxyl group, —O—COR$_4$, —O—R$_5$, —OSi(R$_6$)$_3$, a halogen atom, an optionally substituted alkyl group, an optionally substituted alkenyl group, an optionally substituted phenyl group or an optionally substituted aralkyl group; $R_4$, $R_5$ and $R_6$ represent an optionally substituted lower alkyl group or an optionally substituted phenyl group; X and Y are the same or different and represent —CN, —COOR$_7$, —CONR$_8$R$_9$,

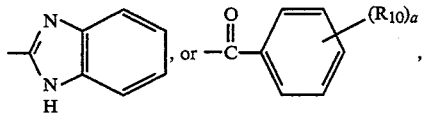

$R_7$ represents an alkyl group; $R_8$ and $R_9$ are the same or different and represent a hydrogen atom, an optionally substituted alkyl or phenyl group; $R_{10}$ represents a hydrogen atom, an optionally substituted alkyl group or a hydroxyl group; and a is a number of 1 to 2, which is suitable for forming fine patterns having high resolution on a substrate having high reflectance.

13 Claims, 4 Drawing Sheets

QUINONE DIAZIDE PHOTORESIST COMPOSITION CONTAINING ALKALI-SOLUBLE RESIN AND AN ULTRAVIOLET RAY ABSORBING DYE

This application is a continuation of application Ser. No. 07/858,446 filed on Mar. 24, 1992, which is a Rule 62 continuation of Ser. No. 07/505,699, filed on Apr. 6, 1990, both now abandoned.

BACKGROUND OF THE INVENTION

1. Field of the Invention

The present invention relates to a photoresist composition which can preferably be used to form fine patterns on a substrate having high reflectance in the production of semiconductors.

2. Description of the Related Art

A photoresist which comprises a sensitizing compound having a quinone diazide group and a novolak resin, or which comprises a bisazide sensitizer and a cyclized rubber, is used in the production of integrated circuits such as LSI.

In a process for producing the integrated circuits, fine patterns are formed on various substrates through photoresists. However, when conventional photoresists are used on substrates having high reflectance such as those made of aluminum, aluminum-silicon, polysilicon and the like, various problems arise. For example, a region which should not be exposed may be exposed because of reflection on a surface of the substrate and/or side walls of steps. This phenomenon is generally referred to as notching or halation.

To solve these problems and prevent deterioration of resolution, Japanese Patent Publication No. 37562/1976 proposes a photoresist composition which comprises, as a light absorber, a dye represented by the formula:

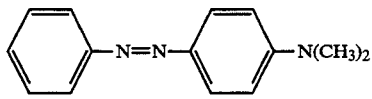

having characteristic absorptions in the ultraviolet range (Oil Yellow [C.I. 11020]). This photoresist composition can decrease light transmission through the photoresist layer and reduce the undesirable exposure of the substrate.

In the context of the present specification, a "photoresist" is intended to mean a composition which comprises a sensitizer and a resin, e.g., novolak, and a "photoresist composition" is intended to mean a composition which comprises a "photoresist" and a light absorber.

In general, if the light absorber is added to the photoresist, undesirable problems may arise. For example, the photoresist drastically loses its sensitivity, and the productivity of the semiconductors is decreased.

The photoresist layer is usually formed by applying the photoresist composition containing a solvent on a wafer and prebaking the wafer with the applied photoresist composition to evaporate off the solvent. However, some light absorbers may precipitate during storage of the photoresist composition, or sublimate during prebaking, so that the concentration of the light absorber in the photoresist layer formed on the wafer may be lowered, which leads to unsatisfactory results or variation in the quality of the produced semiconductors.

To solve these problems, phenylazobenzene derivatives are proposed in Japanese Patent Kokai (Laid-open) Publication Nos. 36838/1980 and 174941/1983. However, the use of such derivatives creates some problems. For example, the phenylazobenzene derivatives should be used in a large amount in order to obtain sufficient absorption at the desired wavelength, especially when the prebaking temperature is raised, or such derivatives possess inferior antisublimation properties, a broad absorption range, low absorbing performance, and undesirable absorption at certain wavelengths. Japanese Patent Kokai Publication No. 93445/1986 discloses a photoresist composition comprising, as a light absorber, a certain styryl compound. Although the disclosed styryl compound can solve the problems associated with the prebaking, it greatly decreases the sensitivity of the photoresist.

SUMMARY OF THE INVENTION

An object of the present invention is to provide a photoresist composition suitable for forming fine patterns having high resolution on a substrate having high reflectance without causing any halation or notching.

Another object of the present invention is to provide a photoresist composition which is stable against the prebaking of the substrate and suffers from less sensitivity deterioration caused by the addition of a light absorber.

DETAILED DESCRIPTION OF THE INVENTION

Figure 1A:
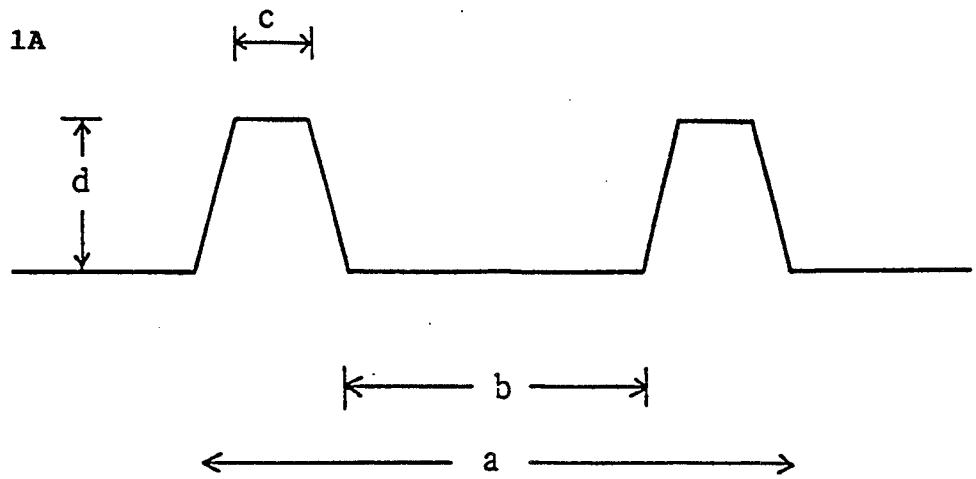
FIGS. 1A and 1B are a cross sectional view and a plan view of a pattern having steps for estimation, respectively.

As a result of extensive study, it has been found that a photoresist composition which comprises a specific compound as a light absorber accomplishes the above objects and solves the problems associated with the prior art. The present invention has been completed based on this finding.

According to the present invention, there is provided a photoresist composition which comprises a compound of the general formula:

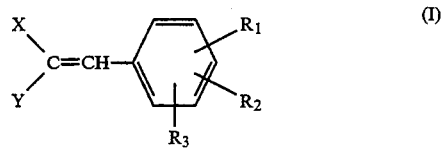

wherein $R_1$, $R_2$ and $R_3$ are the same or different and represent a hydrogen atom, a hydroxyl group, —O—$COR_4$, —O—$R_5$, —OSi($R_6$)$_3$, a halogen atom, an optionally substituted alkyl group, an optionally substituted alkenyl group, an optionally substituted phenyl group or an optionally substituted aralkyl group; $R_4$, $R_5$ and $R_6$ represent an optionally substituted lower alkyl group or an optionally substituted phenyl group; X and Y are the same or different and represent —CN, —COOR$_7$, —CONR$_8$R$_9$, (structure 5: 2-methylbenzimidazole fragment, or —C(=O)—phenyl—(R$_{10}$)$_a$)

R$_7$ represents an alkyl group; R$_8$ and R$_9$ are the same or different and represent a hydrogen atom, an optionally substituted alkyl or phenyl group; R$_{10}$ represents a hydrogen atom, an optionally substituted alkyl group or a hydroxyl group; and a is a number of 1 to 2.

In the general formula (I), an alkyl group as R$_1$, R$_2$, R$_3$, R$_7$, R$_8$, R$_9$ or R$_{10}$ preferably has up to 4 carbon atoms. A lower alkyl group as R$_4$, R$_5$ or R$_6$ preferably has up to 6 carbon atoms, more preferably up to 4 carbon atoms. Examples of the substituent include a hydroxyl group and the like.

A photoresist which comprises a novolak resin and a naphthoquinone diazide compound is preferably used. The novolak resin is obtained through the addition condensation reaction of a phenol compound with formaldehyde.

Also, a photoresist which comprises a cresol novolak resin and an ester of polyhydroxybenzophenone with naphthoquinone-1,2-diazide sulfonic acid is preferably used. The cresol novolak resin can be prepared by reaction of meta-cresol and/or para-cresol with formalin, or reaction of meta-cresol, para-cresol and 3,5-xylenol with formalin. Examples of the polyhydroxybenzophenone are 2,3,4-trihydroxybenzophenone, 2,3,4,4'-tetrahydroxybenzophenone, 2,2',4,4'-tetrahydroxybenzophenone, 2,3,3',4-tetrahydroxybenzophenone, 2,2',3,4,5-pentahydroxybenzophenone, 2,3,3',4,5-pentahydroxybenzophenone, 2,3,3',4,4'-pentahydroxybenzophenone, 2,2',3,4,4'-pentahydroxybenzophenone, 2,2',3,3',4-pentahydroxybenzophenone, and the like.

Preferred examples of the compounds (I) which are suitable as the light absorber in the photoresist composition according to the present invention are as follows. These examples should not limit the scope of the present invention.

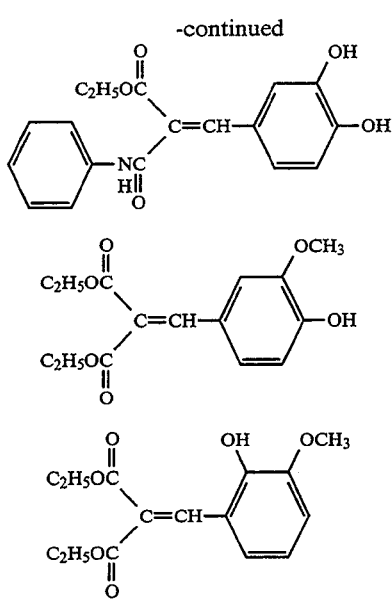

Among the compounds of formula (I), those having absorption in the wavelength range not longer than 550 nm, particularly between 300 to 450 nm, are preferably used in the photoresist composition.

The amount of compound (I) to be added to the photoresist composition is from 0.1 to 20% by weight, preferably from 0.2 to 10% by weight, based on the weight of the solid component in the photoresist.

When the amount of compound (I) is in the above range, the photoresist composition sufficiently prevents halation and has excellent profile and sensitivity.

The photoresist composition may optionally contain at least one other light absorber.

With the photoresist compositions according to the present invention, the problems associated with the prior art can be solved, and patterns with high resolution can be formed on the substrate having high reflectance.

PREFERRED EMBODIMENTS OF THE INVENTION

The present invention will be illustrated in more detail via the following examples, but should not be construed to be limited to these examples.

REFERENCE EXAMPLE 1

In a 300 ml four-necked flask with a stirring bar, a condenser, and a thermometer, 13.8 g of 2,4-dihydroxybenzaidehyde, 25.2 g of diethyl malonate, and 100 g of ethanol were charged and stirred to obtain a homogeneous solution. 0.5 Gram of piperidine was added to the solution and stirred for 20 hours at 20°–25° C. Ethanol was distilled off from a resulting solution by an evaporator to obtain 42.1 g of a tar-like yellow compound. To the resulting compound, 84 g of toluene were added, stirred for one hour at 70°–75° C. and cooled down to room temperature to precipitate the compound. The precipitated compound was filterated and dried to obtain 15.1 g of a crude cake. Then, in a 200 ml four-necked flask, 15.1 g of the crude cake and 90 g of toluene were charged and sintered for 2 hours at 70°–75° C. to obtain a dispersion. After cooling down to room temperature, the cake was filterated and washed with 30 g of toluene. This was repeated twice to obtain 11.7 g of the compound of the following formula (I-a). The purity measured by HPLC was 98.8%, and the structure of the compound was confirmed by NMR and mass spectroscopy.

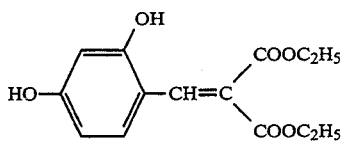

Absorbance of the compound (I-a) in methanol:
$\lambda_{max}$: 352 nm
$\epsilon$: $2.58 \times 10^4$ $M^{-1}.cm^{-1}$

REFERENCE EXAMPLE 2

In a 200 ml four-necked flask with a stirring bar, a condenser, and a thermometer, 12.2 g of parahydroxybenzaldehyde, 9.9 g of malonitrile, and 50 g of ethanol were charged and stirred to obtain a homogeneous solution. 0.5 Gram of piperidine was added to the solution, stirred for 16 hours at 20°–25° C. and filterated to obtain a crystal. 60 Grams of toluene were added to the crystal and stirred for 2 hours, filterated, and dried under vacuum to obtain a crude cake. 12.8 Grams of the crude cake were recrystallized from 32 g of ethyl acetate and dried under vacuum to obtain 4.8 g of the pale yellow compound of the following formula (I-b). The purity measured by HPLC was 98.2% and the structure of the compound was confirmed by NMR and mass spectroscopy.

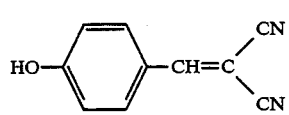

Absorbance of the compound (I-b) in methanol:
$\lambda_{max}$: 535 nm
$\epsilon$: $2.91 \times 10^4$ $M^{-1}.cm^{-1}$

REFERENCE EXAMPLE 3

In a 200 ml four-necked flask with a stirring bar, a condenser, and a thermometer, 13.8 g of 2,4-dihydroxybenzaidehyde, 80 g of ethanol and 13.6 g of ethyl cyanoacetate were charged and stirred to obtain a homogeneous solution. 0.3 Gram of piperidine was added to the solution, stirred for 20 hours at 20°–25° C. and filterated to obtain a crystal. 100 Grams of ethanol was added to the crystal, and stirred for 2 hours, and filterated to obtain a cake. The cake was rinsed with 50 g of ethanol and dried under vacuum to obtain 18.4 g of the pale yellow compound of the formula (I-c). The purity measured by HPLC was 97.8%, and the structure of the compound was confirmed by NMR and mass spectroscopy.

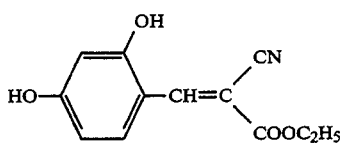

Absorbance of the compound (I-c) in methanol:
$\lambda_{max}$: 438 nm
$\epsilon$: $3.46 \times 10^4$ $M^{-1}.cm^{-1}$

REFERENCE EXAMPLE 4

In a 200 ml four-necked flask with a stirring bar, a condenser, and a thermometer, 4.20 g of the compound obtained in Reference Example 1, 84 g of tetrahydrofuran, and 1.59 g of triethylamine were charged and stirred to obtain a homogeneous solution. 1.18 Grams of acetic chloride were diluted with 6.0 g of tetrahydrofuran (the molar ratio of the hydroxyl group to acetic chloride being 1:1) and added dropwise to the above homogeneous solution over 30 minutes at 20°–25° C. After stirring for a further 2 hours, the solution was poured into 500 ml of water and stirred for one hour. The mixture was filterated, rinsed with 300 ml of water, and dried under vacuum at 50°–60° C. to obtain 4.65 g of a partially acetylated compound of the compound (I-a).

Absorption of the partially acetylated compound in methanol:

$\lambda_{max}$: 343 nm
$\epsilon$: $1.44 \times 10^4$ M$^{-1}$.cm$^{-1}$

REFERENCE EXAMPLE 5

The same procedures of Reference Example 4 were repeated except that the compound (I-c) obtained in Reference Example 3 was used instead of the compound (I-a) to obtain a partially acetylated compound of the formula (I-c).

Absorbance of the partially acetylated compound in methanol:

$\lambda_{max}$: 350 nm
$\epsilon$: $1.01 \times 10^4$ M$^{-1}$.cm$^{-1}$
$\lambda_{2\ max}$: 438 nm
$\epsilon_2$: $7.70 \times 10^4$ M$^{-1}$.cm$^{-1}$

EXAMPLES 1–4 AND COMPARATIVE EXAMPLE 2

Photoresist compositions were prepared by adding each dye compound shown in Table I to a positive photoresist PF-6200 (manufactured by Sumitomo Chemical Company, Limited; a solid content of 31.0% by weight), which comprises a novolak resin and at least one compound having o-quinone diazide groups. The amount of each dye compound added was determined to have the same absorbance as that in Comparative Example 2 (the amount of dye compound was 10% by weight).

Each of the photoresist compositions was coated on a 4 inch square silicon wafer with an aluminum film on its surface by means of a spinner so as to form a resist film of 1.80 μm in thickness. Subsequently, the silicon wafer was baked for one minute on a hot plate kept at 100° C. and exposed to light (i-line of 365 nm) through a test reticule while varying the exposure value stepwise by means of a reduced projection exposing apparatus. Thereafter, the silicon wafer was developed by a static paddle method for 60 seconds at 23° C. in a developing solution SOPD (manufactured by Sumitomo Chemical Company, Limited) by means of an automatic developing machine. The results are shown in Table I.

Figure 1B:
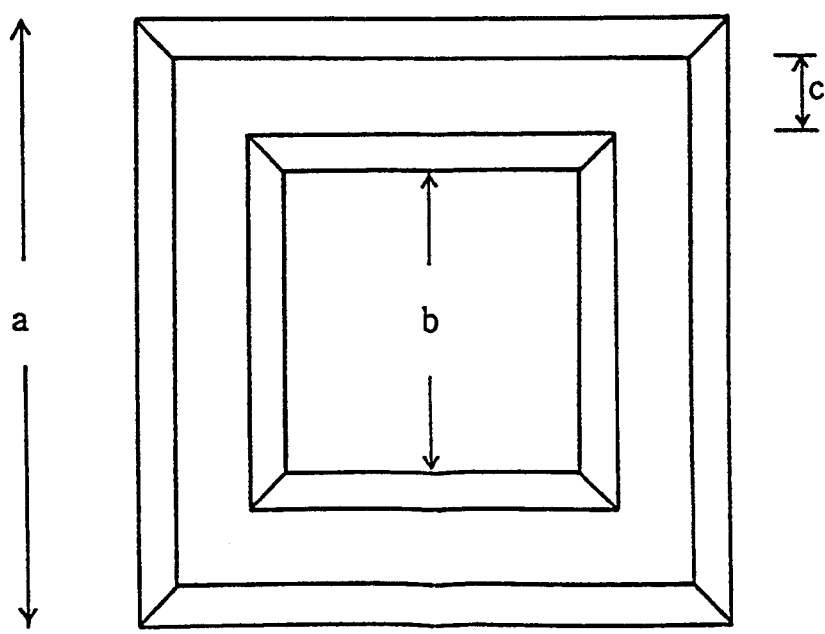

The anti-halation effect was estimated as follows:
The method of estimation of a preventive effect of halation
1. Making a substrate having steps for estimation On a silicon substrate having a SiO$_2$ film of 1 μm in thickness, a pattern having steps a shape of which is shown in FIGS. 1A and 1B was formed by photolithography, etching, and aluminum spattering. Typical pattern sizes are a=4 μm, b=2 μm, c=1 μm and d=1 μm.

2. Estimation of anti-halation effect

On the above substrate having high reflectance and the steps, a resist film of 2 μm in thickness was coated by the spin coat method.

Figure 2:
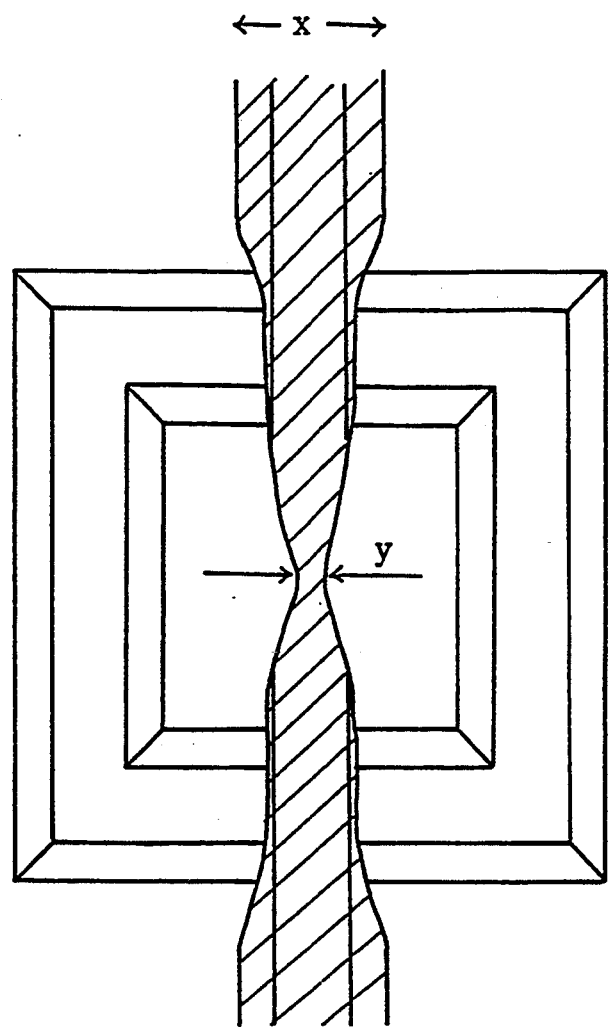
FIG. 2 is a plane view of a substrate after a photoresist is coated, exposed, and developed, in which the hatched part indicates the photoresist.
Figure 3:
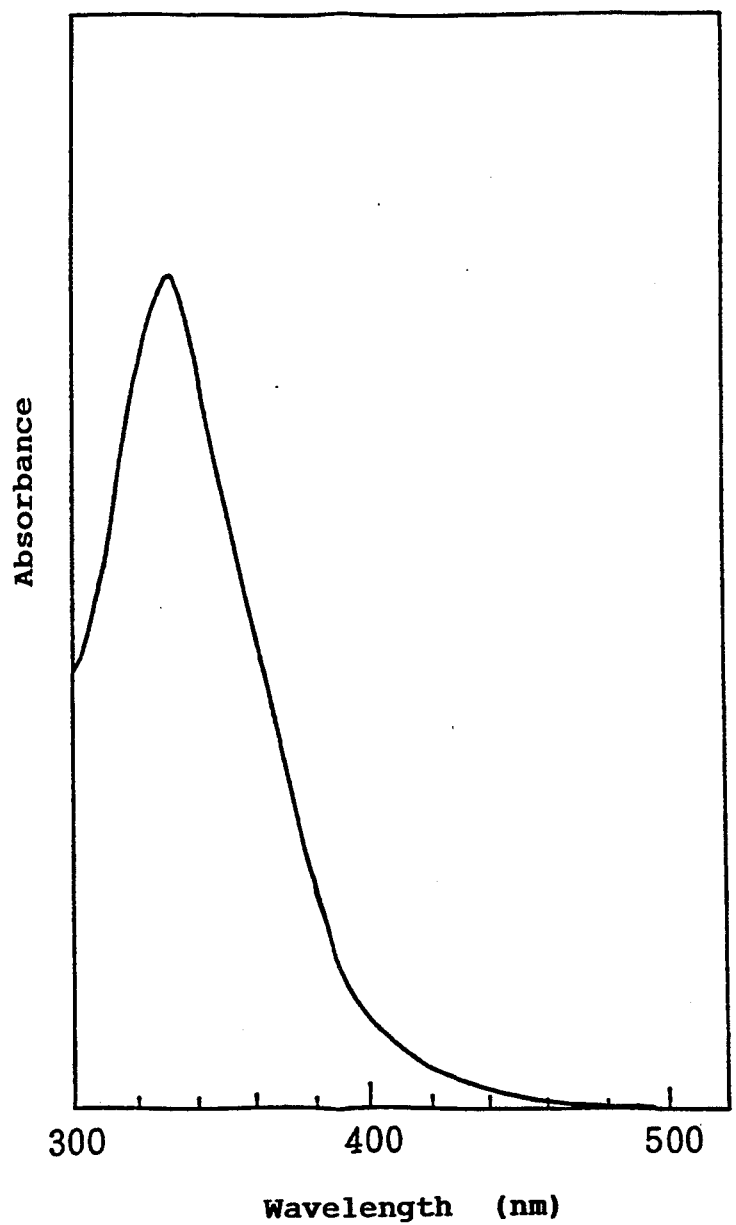
FIGS. 3 and 4 show absorbance curves of the absorbers synthesized in Reference Examples 1 and 3, respectively.
Figure 4:
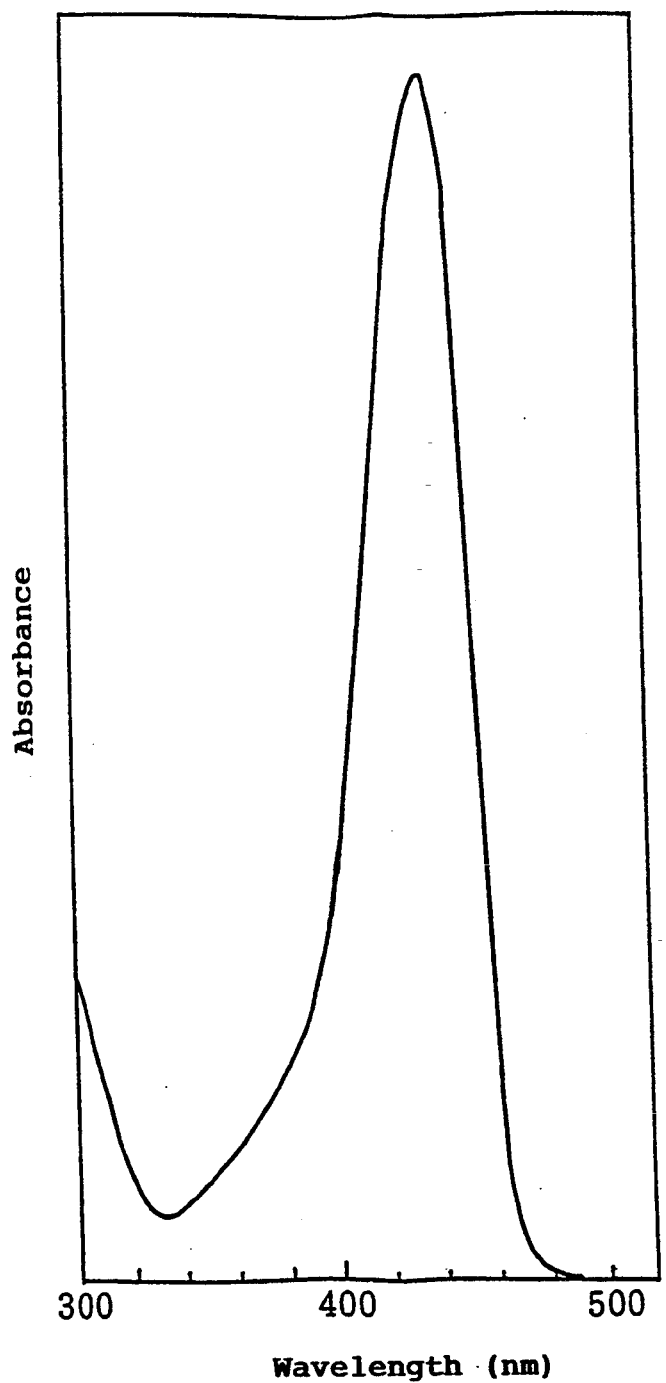

The resist film was exposed to light and developed to make a resist line with a line width of 1.2 μm across the center concave part of the above pattern (see FIG. 2).

A decreasing ratio (R)) of the resist line width in the concave center of the step (y) to a line width in the part having no step (x) was calculated according to the following equation:

$$R = \frac{x - y}{x}$$

In estimating the preventive effect, the exposure dose was settled 1.3 times of the exposure dose at which the remaining film thickness becomes zero.

The anti-halation effect was evaluated according to the following criteria:

Very good: The decreasing ratio of the line width is within 10%.

Good: The decreasing rate of the line width is from 11 to 20%.

No good: The decreasing rate of the line width is more than 20%.

COMPARATIVE EXAMPLE 1

The same procedures as in Comparative Example 2 were repeated except that no absorber was used.

The anti-halation effect was estimated by the same method as in Comparative Example 2, and the results are summarized in Table I.

TABLE I

| Example No. | Absorber compound | Relative sensitivity | Absorbance ratio | Anti-halation effect |
|---|---|---|---|---|
| 1 | (I-a) | 1.2 | 1 | Very good |
| 2 | (I-b) | 1.2 | 1 | Very good |
| 3 | Partially acetylated compound of (I-a) | 1.3 | 1 | Very good |
| 4 | Partially acetylated compound of (I-c) | 1.3 | 1 | Very good |
| Comp. 1 | None | 1 | 0.3 | Not good |
| Comp. 2 | Note *1) | 2.3 | 1 | Good |

Note:
*1) 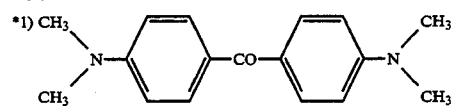

As understood from the results in Table I, patterns with high sensitivity were formed in Examples of the present invention.

The pattern could be resolved sharply. No notching caused by reflected light on the side surfaces of patterns was found. The above results indicate that the photoresist composition of the present invention imparts excellent antihalation properties.

In comparison with the photoresists in the Examples, the photoresists in the Comparative Examples exhibited insufficient sensitivity and anti-halation effect.

What is claimed is:

1. A photoresist composition, which comprises an admixture of an alkali-soluble resin, a quinone diazide compound, and a compound of the general formula:

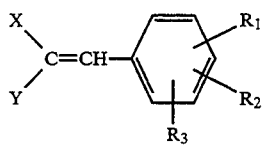 (I)

wherein $R_1$, $R_2$, and $R_3$ are the same or different and represent a hydrogen atom, a hydroxyl group, —$OCOR_4$, —O—$R_5$, —$OSi(R_6)_3$, an optionally substituted alkyl group or an optionally substituted alkenyl group; $R_4$, $R_5$ and $R_6$ represent an optionally substituted lower alkyl group; X and Y are the same or different and represent —CN, —$COOR_7$,

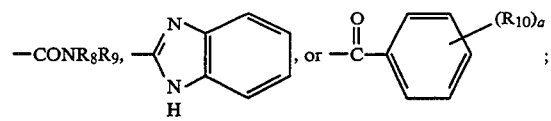

$R_7$ represents an alkyl group; $R_8$ and $R_9$ are the same or different and represent a hydrogen atom, or an optionally substituted alkyl or phenyl group; $R_{10}$ represents a hydrogen atom, an optionally substituted alkyl group, or a hydroxyl group; and is a number from 1 to 2, wherein the amount of said compound of the general formula (I) is from 0.2 to 20% by weight based on the total weight of solid components in said photoresist composition.

2. The photoresist composition according to claim 1, which comprises a novolak resin and a naphthoquinone diazide compound.

3. The photoresist composition according to claim 1, wherein said alkyl group $R_1$, $R_2$, $R_3$, $R_7$, $R_8$, $R_9$, or $R_{10}$ has up to four carbon atoms.

4. The photoresist composition according to claim 1, wherein said lower alkyl group $R_4$, $R_5$, or $R_6$ has up to six carbon atoms.

5. The photoresist composition according to claim 4, wherein said lower alkyl group has up to four carbon atoms.

6. The photoresist composition according to claim 5, wherein said optionally substituted lower alkyl group $R_4$, $R_5$, and $R_6$ includes a hydroxyl group.

7. The photoresist composition according to claim 1, which comprises a cresol novolak resin and an ester of polyhydroxybenzophenone with napthoquinone-1,2-diazide sulfonic acid.

8. The photoresist composition according to claim 7, wherein said polyhydroxybenzophenone is selected from the group consisting of 2,3,4-trihydroxybenzophenone, 2,3,4,4'-tetrahydroxybenzophenone, 2,2',4,4'-tetrahydrozybenzophenone, 2,3,3',4-tetrahydroxybenzophenone, 2,2',3,4,5-pentahydroxybenzophenone, 2,3,3',4,5-pentahydroxybenzophenone, 2,3,3',4,4'-pentahydroxybenzophenone, 2,2',3,4,4'-pentahydroxybenzophenone, and 2,2',3,3'4-pentahydroxybenzophenone.

9. The photoresist composition according to claim 1, wherein said compound of the general formula (I) is selected from the group consisting of:

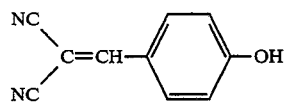 (1)

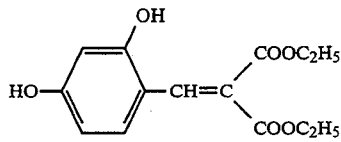 (I-a)

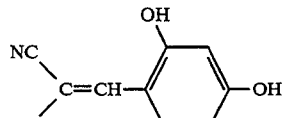 (2)

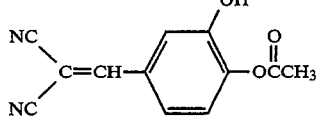 (3)

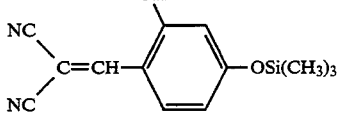 (4)

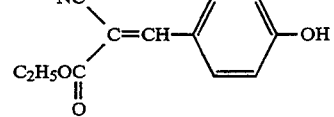 (5)

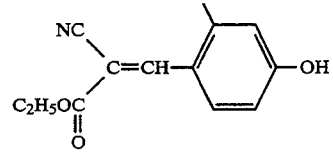 (6)

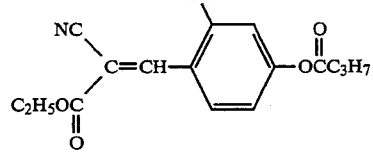 (7)

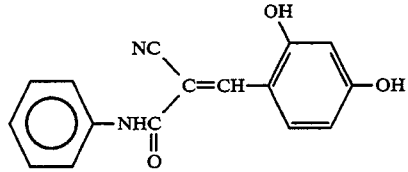 (8)

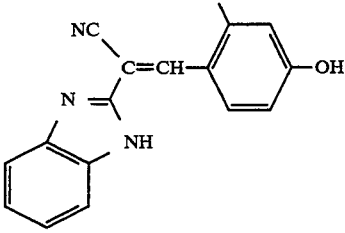 (9)

-continued

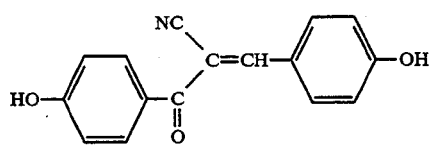 (10)

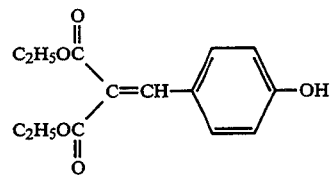 (11)

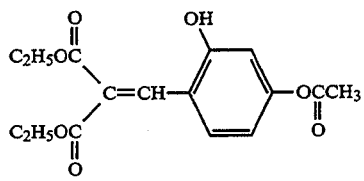 (12)

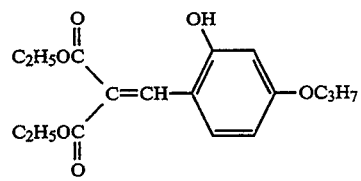 (13)

-continued

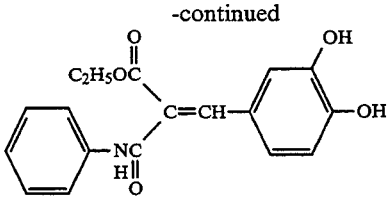 (14)

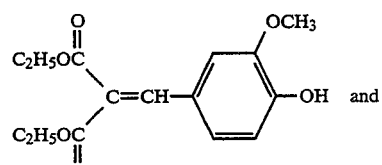 (15) and

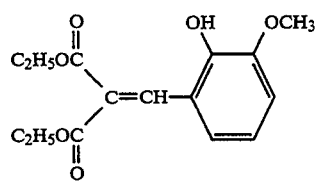 (16)

10. The photoresist composition of claim 1, wherein said compound of formula (I) has absorption in the wavelength range not longer than 550 nm.

11. The photoresist composition according to claim 10, wherein said compound of formula (I) has absorption in the wavelength range between 300 and 450 nm.

12. The photoresist composition according to claim 1, wherein said compound of formula (I) is present in the photoresist composition in an amount from 0.2 to 10% by weight, based on the weight of the solid component in the photoresist.

13. The photoresist composition according to claim 1, further comprising at least one other light absorber.

* * * * *